(12) United States Patent
Kim et al.

(10) Patent No.: US 12,230,663 B2
(45) Date of Patent: Feb. 18, 2025

(54) ELECTRONIC DEVICE COMPRISING IMAGE SENSOR FOR IDENTIFYING AN OPERATION SETTING AND AN EXTERNAL ENVIRONMENTAL CONDITION AND METHOD OF OPERATION THEREOF

(71) Applicant: Samsung Electronics Co., Ltd., Gyeonggi-do (KR)

(72) Inventors: Dongsoo Kim, Gyeonggi-do (KR); Hwayong Kang, Gyeonggi-do (KR); Yeongeun Kim, Gyeonggi-do (KR); Minyoung Park, Gyeonggi-do (KR); Youngkwon Yoon, Gyeonggi-do (KR); Hyeoncheol Jo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 18/132,625

(22) Filed: Apr. 10, 2023

(65) Prior Publication Data
US 2023/0246057 A1 Aug. 3, 2023

Related U.S. Application Data

(63) Continuation of application No. 17/130,778, filed on Dec. 22, 2020, now Pat. No. 11,626,447.

(30) Foreign Application Priority Data

Dec. 23, 2019 (KR) .......................... 10-2019-0172916

(51) Int. Cl.
*H01L 27/146* (2006.01)
*H04N 23/667* (2023.01)
(Continued)

(52) U.S. Cl.
CPC .. *H01L 27/14645* (2013.01); *H01L 27/14609* (2013.01); *H01L 27/14621* (2013.01);
(Continued)

(58) Field of Classification Search
CPC ........... H04N 5/23212; H04N 5/23241; H04N 5/23245; H04N 5/23258; H04N 5/23287;
(Continued)

(56) References Cited

U.S. PATENT DOCUMENTS 9,274,135 B2   3/2016   Kilpatrick et al.
9,829,374 B2   11/2017  Kilpatrick et al.
(Continued)

FOREIGN PATENT DOCUMENTS

JP   2015-201834   11/2015
JP   2019-0082130   5/2019
(Continued)

OTHER PUBLICATIONS

International Search Report dated Apr. 16, 2021 issued in counterpart application No. PCT/KR2020/018873, 6 pages.
(Continued)

*Primary Examiner* — Jennifer D Bennett
*Assistant Examiner* — Erin R Garber
(74) *Attorney, Agent, or Firm* — The Farrell Law Firm, P.C.

(57) ABSTRACT

An electronic device is provided and includes an image sensor including a plurality of unit pixels including a first unit pixel and a second unit pixel, the first unit pixel including a first micro-lens, a first color filter disposed under the first micro-lens, and a first photodiode-array disposed under the first color filter and including a plurality of photodiodes arranged in a same number of columns and rows as each other, and the second unit pixel including a second micro-lens, a second color filter disposed under the second micro-lens and having a different color from that of the first color filter, and a second photodiode-array disposed under the second color filter and including a plurality of
(Continued)

photodiodes arranged in a same number of columns and rows as each other; and a processor operatively coupled with the image sensor, wherein the processor is configured to identify a mode corresponding to an auto-focus function; if the mode is identified as a first mode, perform the auto-focus function based at least in part on comparing a first combined signal generated by combining signals obtained from a first column of the first photodiode-array with a second combined signal generated by combining signals obtained from a second column of the first photodiode-array; if the mode is identified as a second mode different from the first mode, perform the auto-focus function based at least in part on comparing the first combined signal with the second combined signal and comparing a third combined signal generated by combining signals obtained from a first row of the first photodiode-array with a fourth combined signal generated by combining signals obtained from a second row of the first photodiode-array; and generate an image signal based at least in part on signals obtained from the first unit pixel and the second unit pixel while the auto-focus function is performed according to a one of the first mode and the second mode.

18 Claims, 12 Drawing Sheets

(51) Int. Cl.
H04N 23/67 (2023.01)
H04N 25/42 (2023.01)
H04N 25/704 (2023.01)
H04N 23/68 (2023.01)
H04N 25/11 (2023.01)
H04N 25/13 (2023.01)
H04N 25/445 (2023.01)

(52) U.S. Cl.
CPC .. H01L 27/14627 (2013.01); H01L 27/14636 (2013.01); H01L 27/14643 (2013.01); H04N 23/667 (2023.01); H04N 23/67 (2023.01); H04N 25/42 (2023.01); H04N 25/704 (2023.01); H04N 23/6812 (2023.01); H04N 25/11 (2023.01); H04N 25/134 (2023.01); H04N 25/445 (2023.01)

(58) Field of Classification Search
CPC ......... H04N 5/37457; H04N 5/232933; H04N 5/232122; H04N 5/232123; H04N 5/378; H04N 9/04557; H04N 5/235; H04N 5/2352
See application file for complete search history.

(56) References Cited

U.S. PATENT DOCUMENTS

| | | | |
|---|---|---|---|
| 9,973,682 | B2 | 5/2018 | Ham |
| 10,070,088 | B2 | 9/2018 | Ikedo |
| 10,200,646 | B2 | 2/2019 | Kang et al. |
| 10,222,564 | B2 | 3/2019 | Joo et al. |
| 10,371,904 | B2 | 8/2019 | Jou et al. |
| 10,379,317 | B2 * | 8/2019 | Shimokawa ............ G02B 7/28 |
| 10,404,952 | B2 | 9/2019 | Yoon et al. |
| 10,484,627 | B2 | 11/2019 | Zhou |
| 10,547,800 | B2 | 1/2020 | Hwang et al. |
| 10,567,636 | B2 | 2/2020 | Galor Gluskin |
| 10,582,112 | B2 | 3/2020 | Kikuchi et al. |
| 10,594,961 | B2 | 3/2020 | Hirota |
| 10,670,816 | B2 | 6/2020 | Jou et al. |
| 10,674,068 | B2 | 6/2020 | Ouyang |
| 10,715,716 | B2 | 7/2020 | Lee et al. |
| 10,785,438 | B2 | 9/2020 | Ikedo |
| 10,897,587 | B2 | 1/2021 | Hwang et al. |
| 10,951,847 | B2 | 3/2021 | Kang et al. |
| 11,082,645 | B2 | 8/2021 | Takahashi |
| 11,184,566 | B2 | 11/2021 | Hwang et al. |
| 11,290,633 | B2 | 3/2022 | Lee et al. |
| 11,418,751 | B2 | 8/2022 | Kang et al. |
| 11,438,531 | B2 | 9/2022 | Takahashi |
| 11,606,518 | B2 | 3/2023 | Takahashi |
| 11,616,900 | B2 | 3/2023 | Lee et al. |
| 11,778,344 | B2 | 10/2023 | Hwang et al. |
| 11,943,549 | B2 | 3/2024 | Takahashi |
| 12,010,423 | B2 | 6/2024 | Lee et al. |
| 2013/0222553 | A1 * | 8/2013 | Tsuchita ............ H04N 13/218 348/49 |
| 2015/0285613 | A1 | 10/2015 | Kilpatrick et al. |
| 2016/0286108 | A1 | 9/2016 | Fettig et al. |
| 2017/0019584 | A1 | 1/2017 | Ham |
| 2017/0026622 | A1 | 1/2017 | Yoon |
| 2017/0310908 | A1 * | 10/2017 | Hatakeyama ........ H04N 25/134 |
| 2018/0316845 | A1 | 11/2018 | Ouyang |
| 2018/0316878 | A1 | 11/2018 | Zhou |
| 2018/0335583 | A1 | 11/2018 | Jou et al. |
| 2018/0335587 | A1 | 11/2018 | Joe et al. |
| 2018/0343404 | A1 | 11/2018 | Hwang et al. |
| 2018/0352184 | A1 | 12/2018 | Ikedo |
| 2018/0367747 | A1 | 12/2018 | Mo |
| 2019/0045111 | A1 | 2/2019 | Galor Gluskin |
| 2019/0082130 | A1 * | 3/2019 | Li ..................... H01L 27/14645 |
| 2019/0109994 | A1 | 4/2019 | Kikuchi et al. |
| 2020/0252540 | A1 | 8/2020 | Ouyang |
| 2020/0263625 | A1 | 8/2020 | Yamane et al. |
| 2020/0280659 | A1 * | 9/2020 | Galor Gluskin ..... H04N 25/533 |
| 2020/0396400 | A1 | 12/2020 | Takahashi |
| 2021/0006756 | A1 | 1/2021 | Sato et al. |
| 2021/0175270 | A1 | 6/2021 | Pang |
| 2021/0297611 | A1 | 9/2021 | Hwang et al. |

FOREIGN PATENT DOCUMENTS

| | | |
|---|---|---|
| KR | 2017-0011818 | 2/2017 |
| KR | 1020170040572 | 4/2017 |
| KR | 1020180128802 | 12/2018 |
| KR | 1020190101706 | 9/2019 |
| WO | WO 2019/188123 | 10/2019 |

OTHER PUBLICATIONS

European Search Report dated Nov. 21, 2022 issued in counterpart application No. 20904591.3-1208, 10 pages.
European Search Report dated Jan. 3, 2024 issued in counterpart application No. 20904591.3-1208, 5 pages.
European Search Report dated Dec. 23, 2024 issued in counterpart application No. 20904591.3-1207, 60 pages.
Korean Office Action dated Jul. 26, 2024 issued in counterpart application No. 10-2019-0172916, 10 pages.

* cited by examiner

ELECTRONIC DEVICE COMPRISING IMAGE SENSOR FOR IDENTIFYING AN OPERATION SETTING AND AN EXTERNAL ENVIRONMENTAL CONDITION AND METHOD OF OPERATION THEREOF

CROSS-REFERENCE TO RELATED APPLICATION(S)

This application is a Continuation Applications of U.S. application Ser. No. 17/130,778, filed on Dec. 22, 2020, in the United States Patent and Trademark Office, which is based on and claims priority under 35 U.S.C. § 119 to Korean Patent Application No. 10-2019-0172916, filed on Dec. 23, 2019, in the Korean Intellectual Property Office, the disclosures of which are incorporated by reference herein their entireties.

BACKGROUND

1. Field

The disclosure relates to an electronic device including an image sensor and a method of operating the electronic device.

2. Description of Related Art

An image sensor is a device that converts an optical image into an electrical signal. With the development of computer and communication industries, there is an increasing demand on a high-performance image sensor in various electronic devices such as a digital camera, a camcorder, a personal communication system (PCS), a game console, a security camera, a medical micro camera, and a robot.

The image sensor may include at least one micro-lens. At least one pixel may be disposed under the micro-lens.

In an image sensor including a unit pixel in which a plurality of pixels are disposed under a single micro-lens, it may be difficult to generate an image with a high resolution, using left and right images.

SUMMARY

The present disclosure has been made to address the above-mentioned problems and disadvantages, and to provide at least the advantages described below.

In accordance with an aspect of the disclosure, an electronic device includes an image sensor including a plurality of unit pixels including a first unit pixel and a second unit pixel, the first unit pixel including a first micro-lens, a first color filter disposed under the first micro-lens, and a first photodiode-array disposed under the first color filter and including a plurality of photodiodes arranged in a same number of columns and rows as each other, and the second unit pixel including a second micro-lens, a second color filter disposed under the second micro-lens and having a different color from that of the first color filter, and a second photodiode-array disposed under the second color filter and including a plurality of photodiodes arranged in a same number of columns and rows as each other; and a processor operatively coupled with the image sensor, wherein the processor is configured to identify a mode corresponding to an auto-focus function; if the mode is identified as a first mode, perform the auto-focus function based at least in part on comparing a first combined signal generated by combining signals obtained from a first column of the first photodiode-array with a second combined signal generated by combining signals obtained from a second column of the first photodiode-array; if the mode is identified as a second mode different from the first mode, perform the auto-focus function based at least in part on comparing the first combined signal with the second combined signal and comparing a third combined signal generated by combining signals obtained from a first row of the first photodiode-array with a fourth combined signal generated by combining signals obtained from a second row of the first photodiode-array; and generate an image signal based at least in part on signals obtained from the first unit pixel and the second unit pixel while the auto-focus function is performed according to a one of the first mode and the second mode.

In accordance with another aspect of the disclosure, an electronic device includes a memory; a display; a camera module including an image sensor, the image sensor including a plurality of unit pixels including a first unit pixel and a second unit pixel, the first unit pixel including a first micro-lens, a first color filter disposed under the first micro-lens, and a first photodiode-array disposed under the first color filter and including a plurality of photodiodes arranged in a same number of columns and rows as each other, and the second unit pixel including a second micro-lens, a second color filter disposed under the second micro-lens and having a different color from that of the first color filter, and a second photodiode-array disposed under the second color filter and including a plurality of photodiodes arranged in a same number of columns and rows as each other; and a processor operatively coupled with the image sensor, wherein the processor is configured to identify a mode corresponding to an auto-focus function for the camera module; if the mode is identified as a first mode, perform the auto-focus function based at least in part on comparing a first combined signal generated by combining signals obtained a first column of the first photodiode-array with a second combined signal generated by combining signals obtained from a second column of the first photodiode-array; if the mode is identified as a second mode different from the first mode, perform the auto-focus function based at least in part on comparing the first combined signal with the second combined signal and comparing a third combined signal generated by combining signals obtained from a first row of the first photodiode-array with a fourth combined signal generated by combining signals obtained from a second row of the first photodiode-array; and display, via the display, an image generated based at least in part on signals obtained from the first unit pixel and the second unit pixel while the auto-focus function is performed according to a one of the first mode and the second mode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

An aspect of the disclosure is to provide an image sensor capable of implementing a high-resolution image.

Hereinafter, various embodiments of the disclosure will be described with reference to accompanying drawings. However, it should be understood that this is not intended to limit the disclosure to specific implementation forms and includes various modifications, equivalents, and/or alternatives of embodiments of the disclosure.

Figure 1:
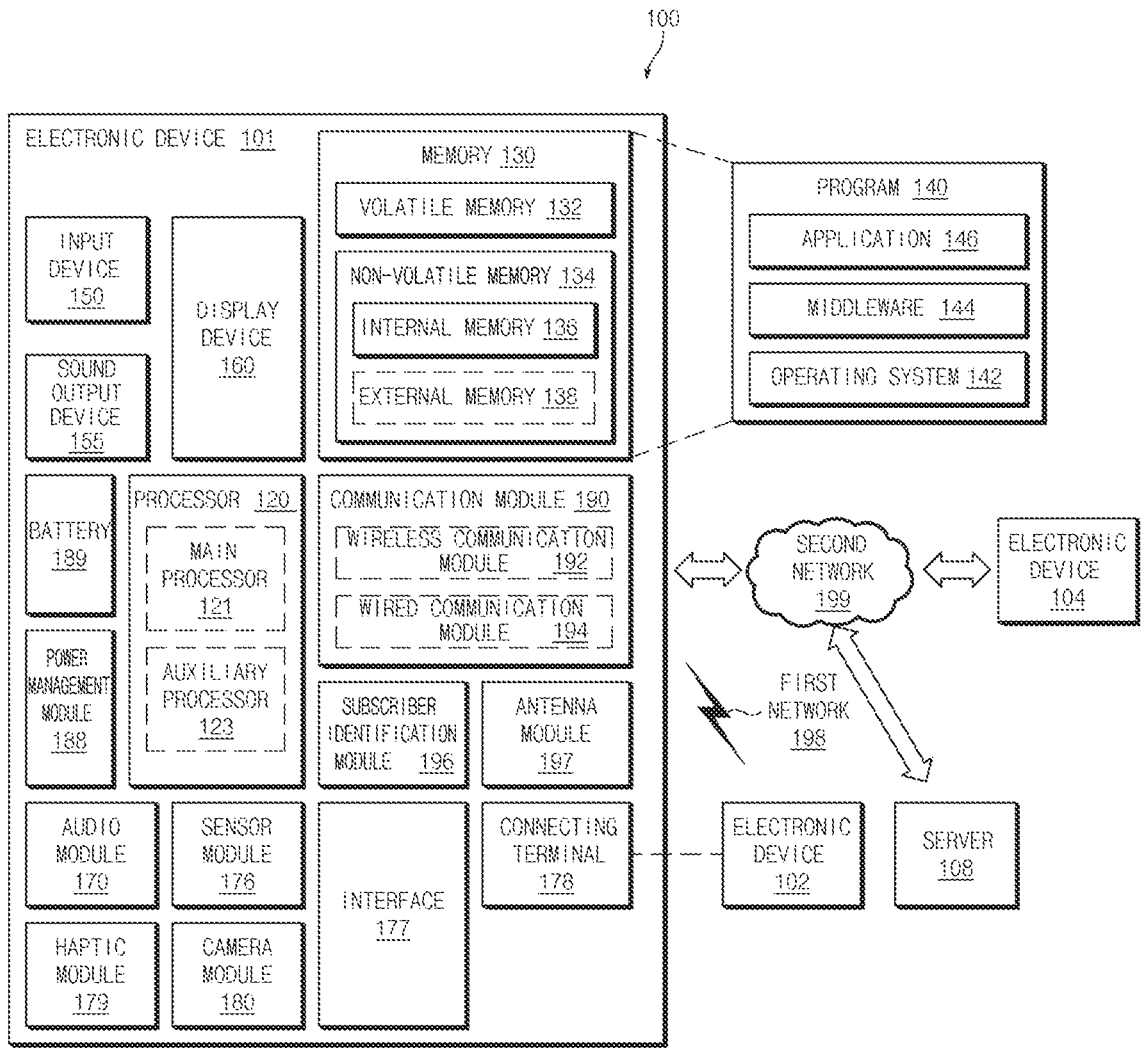
FIG. 1 is a block diagram of an electronic device in a network environment 100, according to an embodiment.

FIG. 1 is a diagram illustrating an electronic device in a network environment according to various embodiments. Referring to FIG. 1, an electronic device 101 may communicate with an electronic device 102 through a first network 198 (e.g., a short-range wireless communication network) or may communicate with an electronic device 104 or a server 108 through a second network 199 (e.g., a long-distance wireless communication network) in a network environment 100. According to an embodiment, the electronic device 101 may communicate with the electronic device 104 through the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, or an antenna module 197. According to some embodiments, at least one among components of the electronic device 101 may be omitted or one or more other components may be added to the electronic device 101. According to some embodiments, some of the above components may be implemented with one integrated circuit. For example, the sensor module 176 (e.g., a fingerprint sensor, an iris sensor, or an illuminance sensor) may be embedded in the display device 160 (e.g., a display).

The processor 120 may execute, for example, software (e.g., a program 140) to control at least one of other components (e.g., a hardware or software component) of the electronic device 101 connected to the processor 120 and may process or compute a variety of data. According to an embodiment, as a part of data processing or operation, the processor 120 may load a command set or data, which is received from other components (e.g., the sensor module 176 or the communication module 190), into a volatile memory 132, may process the command or data loaded into the volatile memory 132, and may store result data into a nonvolatile memory 134. According to an embodiment, the processor 120 may include a main processor 121 (e.g., a central processing unit or an application processor) and an auxiliary processor 123 (e.g., a graphic processing device, an image signal processor, a sensor hub processor, or a communication processor), which operates independently from the main processor 121 or with the main processor 121. Additionally or alternatively, the auxiliary processor 123 may use less power than the main processor 121, or is specified to a designated function. The auxiliary processor 123 may be implemented separately from the main processor 121 or as a part thereof.

The auxiliary processor 123 may control, for example, at least some of functions or states associated with at least one component (e.g., the display device 160, the sensor module 176, or the communication module 190) among the components of the electronic device 101 instead of the main processor 121 while the main processor 121 is in an inactive (e.g., sleep) state or together with the main processor 121 while the main processor 121 is in an active (e.g., an application execution) state. According to an embodiment, the auxiliary processor 123 (e.g., the image signal processor or the communication processor) may be implemented as a part of another component (e.g., the camera module 180 or the communication module 190) that is functionally related to the auxiliary processor 123.

The memory 130 may store a variety of data used by at least one component (e.g., the processor 120 or the sensor module 176) of the electronic device 101. For example, data may include software (e.g., the program 140) and input data or output data with respect to commands associated with the software. The memory 130 may include the volatile memory 132 or the nonvolatile memory 134.

The program 140 may be stored in the memory 130 as software and may include, for example, an operating system 142, a middleware 144, or an application 146.

The input device 150 may receive a command or data, which is used for a component (e.g., the processor 120) of the electronic device 101, from an outside (e.g., a user) of the electronic device 101. The input device 150 may include, for example, a microphone, a mouse, a keyboard, or a digital pen (e.g., a stylus pen).

The sound output device 155 may output a sound signal to the outside of the electronic device 101. The sound output device 155 may include, for example, a speaker or a receiver. The speaker may be used for general purposes, such as multimedia play or recordings play, and the receiver may be used for receiving calls. According to an embodiment, the receiver and the speaker may be either integrally or separately implemented.

The display device 160 may visually provide information to the outside (e.g., the user) of the electronic device 101. For example, the display device 160 may include a display, a hologram device, or a projector and a control circuit for controlling a corresponding device. According to an embodiment, the display device 160 may include a touch circuitry configured to sense the touch or a sensor circuit (e.g., a pressure sensor) for measuring an intensity of pressure on the touch.

The audio module 170 may convert a sound and an electrical signal in dual directions. According to an embodiment, the audio module 170 may obtain the sound through the input device 150 or may output the sound through the sound output device 155 or an external electronic device (e.g., the electronic device 102 (e.g., a speaker or a headphone)) directly or wirelessly connected to the electronic device 101.

The sensor module 176 may generate an electrical signal or a data value corresponding to an operating state (e.g., power or temperature) inside or an environmental state (e.g., a user state) outside the electronic device 101. According to an embodiment, the sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support one or more designated protocols to allow the electronic device 101 to connect directly or wirelessly to the external electronic device (e.g., the electronic device 102). According to an embodiment, the interface 177 may include, for example, an HDMI (high-definition multimedia interface), a USB (universal serial bus) interface, an SD card interface, or an audio interface.

A connecting terminal 178 may include a connector that physically connects the electronic device 101 to the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal to a mechanical stimulation (e.g., vibration or movement) or an electrical stimulation perceived by the user through tactile or kinesthetic sensations. According to an embodiment, the haptic module 179 may include, for example, a motor, a piezoelectric element, or an electric stimulator.

The camera module 180 may shoot a still image or a video image. According to an embodiment, the camera module 180 may include, for example, at least one or more lenses, image sensors, image signal processors, or flashes.

The power management module 188 may manage power supplied to the electronic device 101. According to an embodiment, the power management module 188 may be implemented as at least a part of a power management integrated circuit (PMIC).

The battery 189 may supply power to at least one component of the electronic device 101. According to an embodiment, the battery 189 may include, for example, a non-rechargeable (primary) battery, a rechargeable (secondary) battery, or a fuel cell.

The communication module 190 may establish a direct (e.g., wired) or wireless communication channel between the electronic device 101 and the external electronic device (e.g., the electronic device 102, the electronic device 104, or the server 108) and support communication execution through the established communication channel. The communication module 190 may include at least one communication processor operating independently from the processor 120 (e.g., the application processor) and supporting the direct (e.g., wired) communication or the wireless communication. According to an embodiment, the communication module 190 may include a wireless communication module 192 (e.g., a cellular communication module, a short-range wireless communication module, or a GNSS (global navigation satellite system) communication module) or a wired communication module 194 (e.g., an LAN (local area network) communication module or a power line communication module). The corresponding communication module among the above communication modules may communicate with the external electronic device 104 through the first network 198 (e.g., the short-range communication network such as a Bluetooth, a WiFi direct, or an IrDA (infrared data association)) or the second network 199 (e.g., the long-distance wireless communication network such as a cellular network, an internet, or a computer network (e.g., LAN or WAN)). The above-mentioned various communication modules may be implemented into one component (e.g., a single chip) or into separate components (e.g., chips), respectively. The wireless communication module 192 may identify and authenticate the electronic device 101 using user information (e.g., international mobile subscriber identity (IMSI)) stored in the subscriber identification module 196 in the communication network, such as the first network 198 or the second network 199.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some components among the components may be connected to each other through a communication method (e.g., a bus, a GPIO (general purpose input and output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 101 and the external electronic device 104 through the server 108 connected to the second network 199. Each of the electronic devices 102 and 104 may be the same or different types as or from the electronic device 101. According to an embodiment, all or some of the operations performed by the electronic device 101 may be performed by one or more external electronic devices among the external electronic devices 102, 104, or 108. For example, when the electronic device 101 performs some functions or services automatically or by request from a user or another device, the electronic device 101 may request one or more external electronic devices to perform at least some of the functions related to the functions or services, in addition to or instead of performing the functions or services by itself. The one or more external electronic devices receiving the request may carry out at least a part of the requested function or service or the additional function or service associated with the request and transmit the execution result to the electronic device 101. The electronic device 101 may provide the result as is or after additional processing as at least a part of the response to the request. To this end, for example, a cloud computing, distributed computing, or client-server computing technology may be used.

Figure 2:
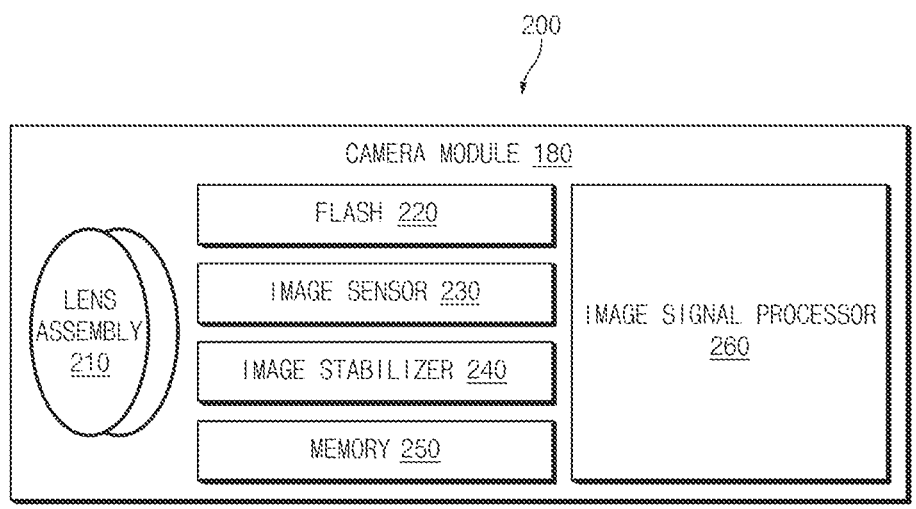
FIG. 2 is a block diagram illustrating a camera module, according to an embodiment.

FIG. 2 is a block diagram 200 illustrating the camera module 180 according to various embodiments. Referring to FIG. 2, the camera module 180 may include a lens assembly 210, a flash 220, an image sensor 230, an image stabilizer 240, a memory 250 (e.g., buffer memory), or an image signal processor 260. The lens assembly 210 may collect light emitted from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., view angle, focal length, auto-focusing, f number, or optical zoom), or at least one lens assembly may have one or more lens attributes different from those of another lens assembly. The lens assembly 210 may include, for example, a wide-angle lens or a telephoto lens.

The flash 220 may emit light that is used to reinforce light emitted or reflected from an object. According to an embodiment, the flash 220 may include one or more light emitting diodes (LEDs) (e.g., a red-green-blue (RGB) LED, a white LED, an infrared (IR) LED, or an ultraviolet (UV) LED) or a xenon lamp. The image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor (not shown) or an acceleration sensor (not shown) disposed inside or outside the camera module 180. According to an embodiment, the image stabilizer 240 may be implemented, for example, as an optical image stabilizer. The memory 250 may store, at least temporarily, at least part of an image obtained via the image sensor 230 for a subsequent image processing task. For example, when the image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display device 160. Thereafter, when a specified condition is met (e.g., by a user's input or system command), at least part of the raw image stored in the memory 250 may be obtained and processed, for example, by the image signal processor 260. According to an embodiment, the memory 250 may be configured as at least part of the memory 130 or as a separate memory that is operated independently from the memory 130.

The image signal processor 260 may perform one or more image processing on an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 260 may control (e.g., exposure time control or read-out timing control) at least one (e.g., the image sensor 230) of the components included in the camera module 180. An image processed by the image signal processor 260 may be stored back in the memory 250 for further processing, or may be provided to an external component (e.g., the memory 130, the display device 160, the electronic device 102, the electronic device 104, or the server 108) outside the camera module 180. According to an embodiment, the image signal processor 260 may be configured as at least part of the processor 120, or as a separate processor that is operated independently from the processor 120. When the image signal processor 260 is configured as a separate processor from the processor 120, at least one image processed by the image signal processor 260 may be displayed, by the processor 120, via the display device 160 as it is or after being further processed.

According to an embodiment, the electronic device 101 may include a plurality of camera modules 180 having different attributes or functions. In such a case, at least one of the plurality of camera modules 180 may form, for example, a wide-angle camera and at least another of the plurality of camera modules 180 may form a telephoto camera. Similarly, at least one of the plurality of camera modules 180 may form, for example, a front camera and at least another of the plurality of camera modules 180 may form a rear camera.

Hereinafter, an electronic device will be described with reference to FIGS. 3, 4, and 5. For clarity, contents the same as the above-described details are briefly described or omitted.

Figure 3:
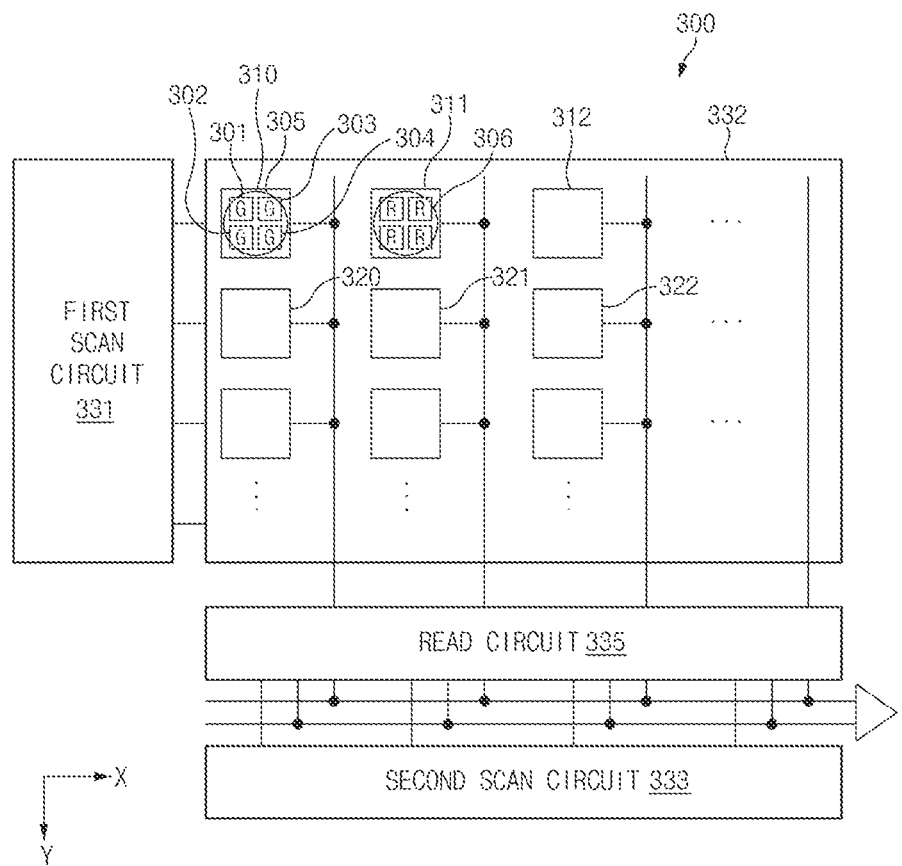
FIG. 3 is a diagram illustrating an image sensor, according to an embodiment.

FIG. 3 is a diagram illustrating an image sensor 300, according to an embodiment. FIG. 4 is a diagram 400 for describing unit pixels, according to an embodiment. FIG. 5 is a cross-sectional view 500 illustrating a cross-section of a single unit pixel of FIG. 4 taken along line z-z', according to an embodiment.

Referring to FIG. 3, the image sensor 300 includes a pixel array 332, a first scan circuit 331, a second scan circuit 333, and a read circuit 335.

The pixel array 332 may include a plurality of pixels units including a first pixel unit 310, a second pixel unit 311, a third pixel unit, 312, a fourth pixel unit 320, a fifth pixel unit, and a sixth pixel unit 322. Additional pixel units may also be included in the plurality of pixel units. The plurality of unit pixels may be arranged along an X direction (e.g., a row direction) and a Y direction (e.g., a column direction).

Each of a plurality of unit pixels may include one micro-lens. For example, the first unit pixel 310 may include a first micro-lens 305 and/or the second unit pixel 311 may include a second micro-lens 306.

Each of the plurality of unit pixels may include at least one photodiode (e.g., a first photodiode 301, a second photodiode 302, a third photodiode 303, and a fourth photodiode 304). The number of photodiodes included in each of the plurality of unit pixels may be based on the number of pixels included in each of the plurality of unit pixels.

The first scan circuit 331 and the second scan circuit 333 may detect signals for each of the plurality of pixels units including the first pixel unit 310, the second pixel unit 311, the third pixel unit, 312, the fourth pixel unit 320, the fifth pixel unit, and the sixth pixel unit 322 under the control of a processor. The first scan circuit 331 may detect a signal for each of the plurality of pixels units including the first pixel unit 310, the second pixel unit 311, the third pixel unit, 312, the fourth pixel unit 320, the fifth pixel unit, and the sixth pixel unit 322 in the Y direction. The second scan circuit 333 may detect a signal for each of the plurality of pixels units including the first pixel unit 310, the second pixel unit 311, the third pixel unit, 312, the fourth pixel unit 320, the fifth pixel unit, and the sixth pixel unit 322 in the X direction. The read circuit 335 may read the detected signal.

Each of the plurality of pixels units including the first pixel unit 310, the second pixel unit 311, the third pixel unit, 312, the fourth pixel unit 320, the fifth pixel unit, and the sixth pixel unit 322 may include n×n pixels (where "n" is a natural number greater than 1). The first unit pixel 310 may include n×n pixels overlapping with the first micro-lens 305 and/or the second unit pixel 311 may include n×n pixels overlapping with the second micro-lens 306. Each of the n×n pixels may correspond to a single photodiode.

Each of the plurality of pixels including the first pixel unit 310, the second pixel unit 311, the third pixel unit, 312, the fourth pixel unit 320, the fifth pixel unit, and the sixth pixel unit 322 may include a single micro-lens, a plurality of photodiodes, and a color filter (e.g., green) of one color.

Hereinafter, unit pixels included in the pixel array 332 of the image sensor 300 of FIG. 3 will be described in detail with reference to FIGS. 4 and 5.

Figure 4:
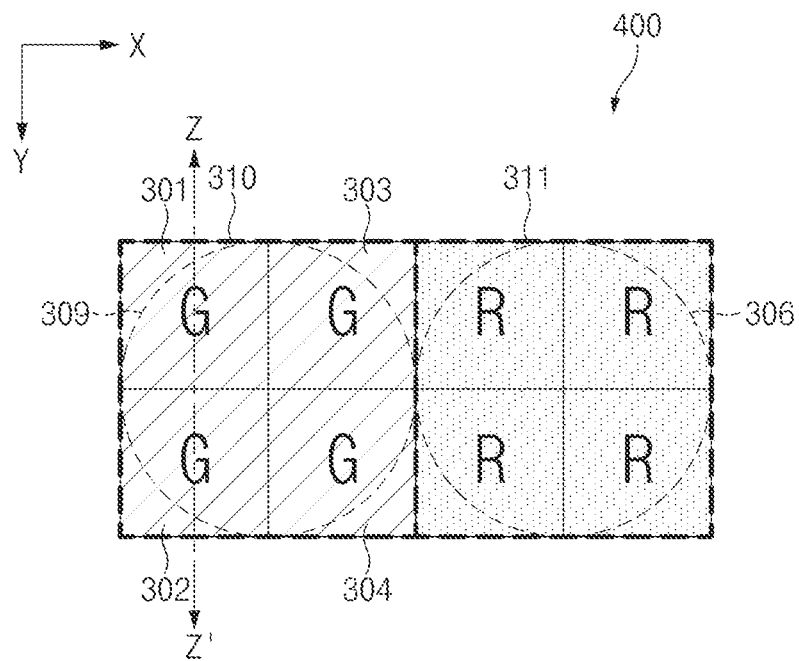
FIG. 4 is a diagram for describing unit pixels, according to an embodiment.

Referring to FIG. 4, each of a plurality of unit pixels include 2×2 photodiodes. For example, the first unit pixel 310 may include the first photodiode 301, the second photodiode 302, the third photodiode 303, and the fourth photodiode 304, which are arranged to overlap with the first micro-lens 305. The first photodiode 301 and the third photodiode 303 may be arranged along the first row. The second photodiode 302 and the fourth photodiode 304 may be arranged along the second row. The first photodiode 301 and the second photodiode 302 may be arranged along the first column. The third photodiode 303 and the fourth photodiode 304 may be arranged along the second column. Each of the first photodiode 301, the second photodiode 302, the third photodiode 303, and the fourth photodiode 304 may correspond to a single pixel.

The first unit pixel 310 may include one micro-lens 305, the first photodiode 301, the second photodiode 302, the third photodiode 303, the fourth photodiode 304, and a green (G) color filter. The second unit pixel 311 may have the same structure as the first unit pixel 310, and thus the description thereof will be omitted. However, the color of the color filter included in each of the unit pixels may be green (G), and may also be different from one another, such as red (R), or blue (B).

Figure 5:
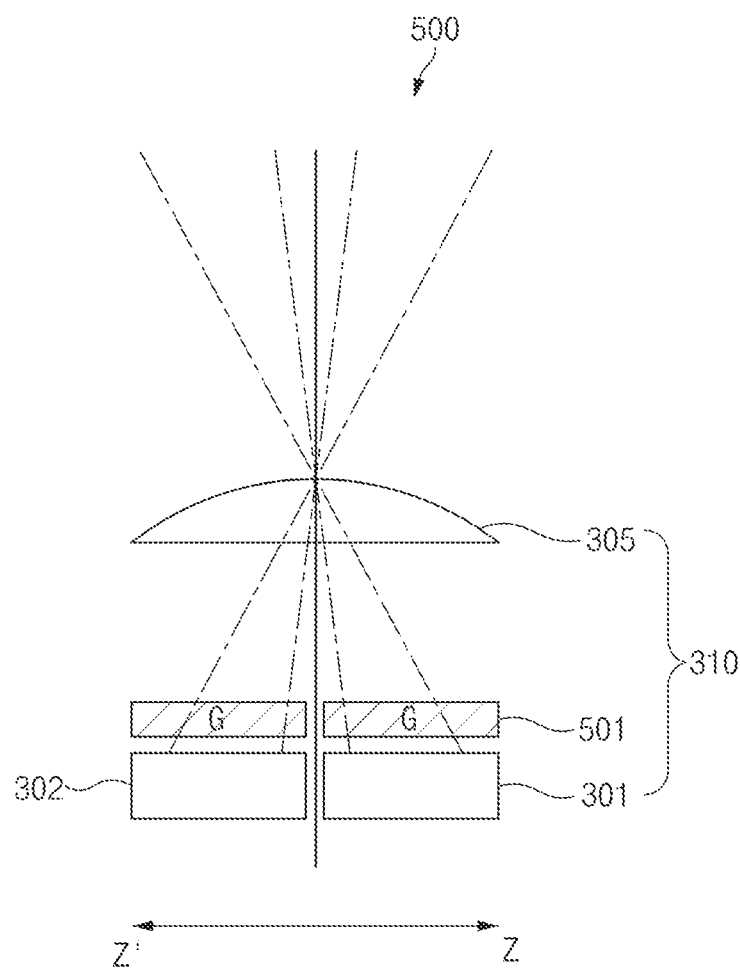
FIG. 5 is a cross-sectional view illustrating a cross-section of a single unit pixel of FIG. 4 taken along line z-z', according to an embodiment.

Referring to FIG. 5, in the first unit pixel 310, the first micro-lens 305, the first photodiode 301 and the second photodiodes 302 may be disposed to face each other with a color filter 501 interposed therebetween. The light incident on the image sensor may be condensed through the first micro-lens 305 and may be incident on different photodiodes. The signal for the light incident on each photodiode may be detected by the first scan circuit 331 or the second scan circuit 333.

Hereinafter, the operation of an electronic device according to an embodiment will be described with reference to FIGS. 6, 7, 8, and 9. For clarity, contents which are the same as the above-described details are briefly described or omitted.

Hereinafter, it is assumed that the image sensor 300 of FIG. 3 performs the process of FIG. 6. The operation described as being performed by the image sensor 300 may be performed by a synthetic signal forming unit 701, a disparity calculation unit 702, and/or a remosaic processing unit 703 included in the image sensor 300.

Figure 6:
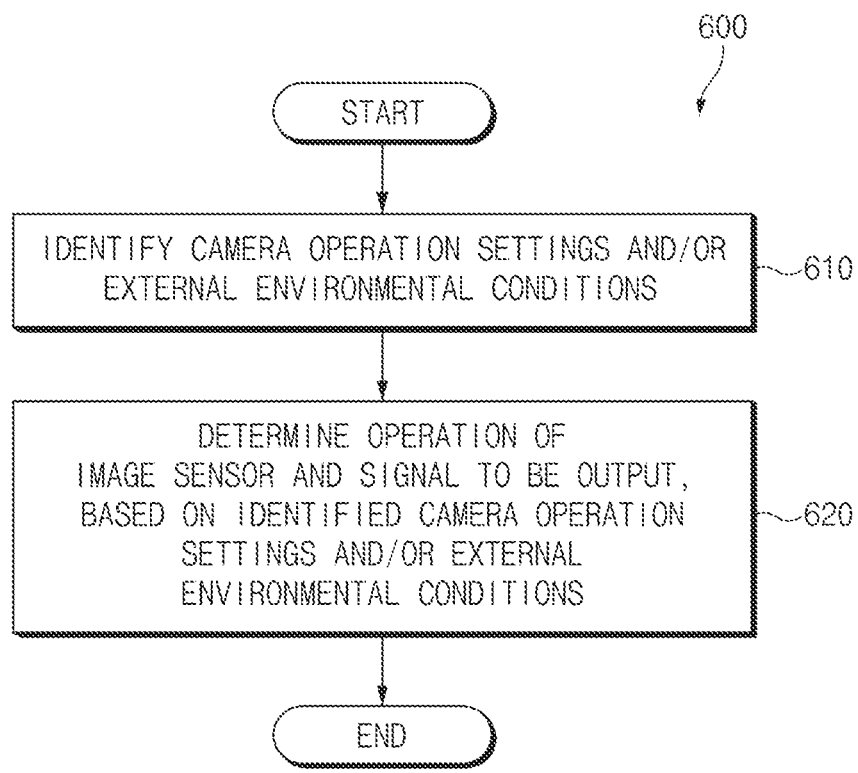
FIG. 6 is a flowchart for describing an operation of an image sensor, according to an embodiment.
Figure 7:
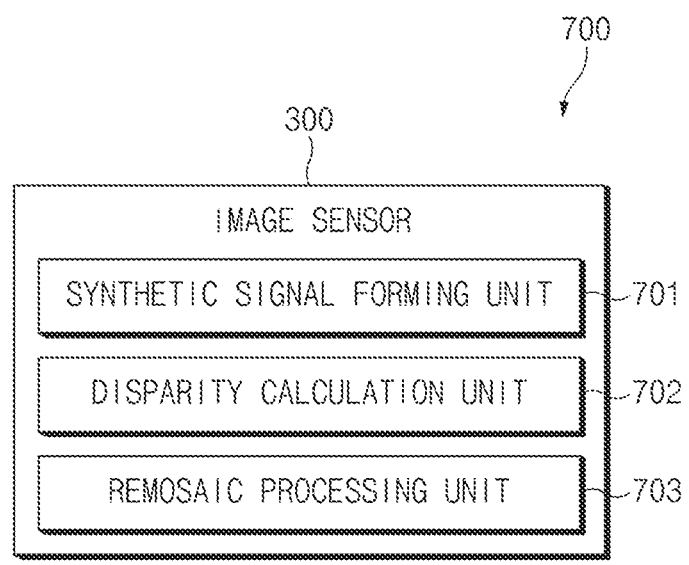
FIG. 7 is a block diagram illustrating pieces of hardware included in an image sensor, according to an embodiment.
Figure 8:
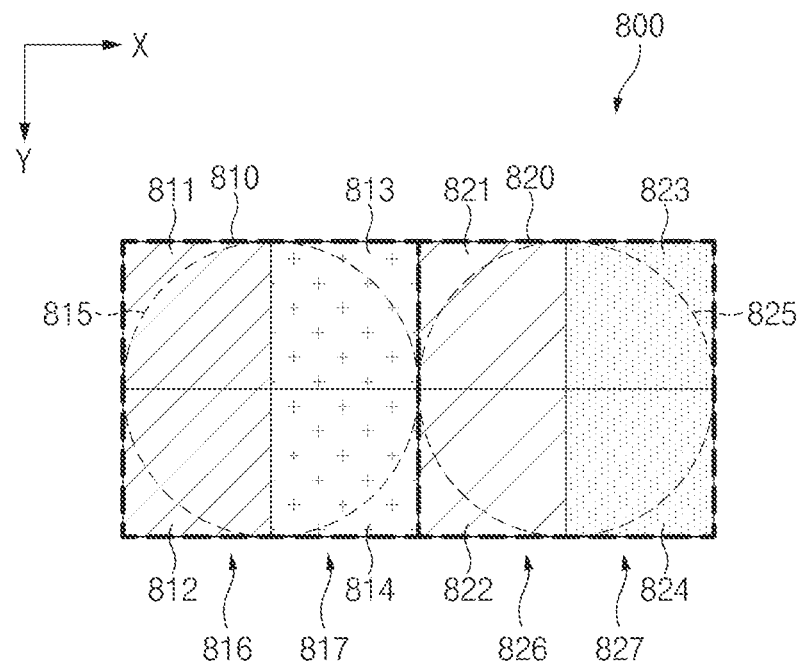
FIG. 8 is a diagram illustrating unit pixels included in an image sensor, according to an embodiment.
Figure 9:
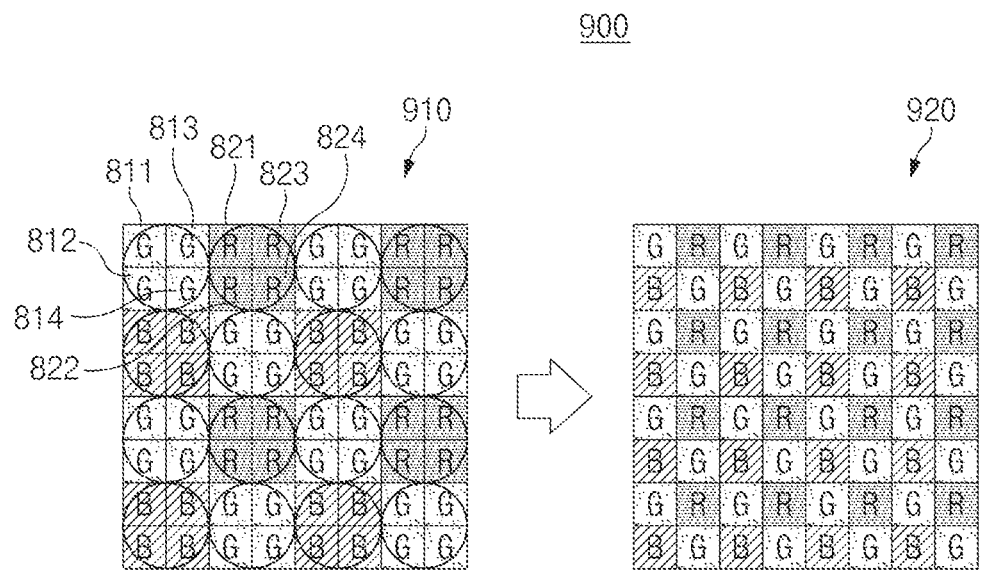
FIG. 9 is a diagram illustrating an example of forming a Bayer-patterned image based on signals of an image sensor, according to an embodiment.

FIG. 6 is a flowchart 600 for describing an operation of an image sensor 300, according to an embodiment. FIG. 7 is a block diagram 700 illustrating pieces of hardware included in an image sensor 300, according to an embodiment. FIG. 8 is a diagram 800 illustrating unit pixels included in an image sensor 300, according to an embodiment. FIG. 9 is a diagram 900 illustrating an example of forming a Bayer-patterned image based on signals of an image sensor, according to an embodiment.

Referring to FIG. 6, in step 610, an image sensor identifies camera operation settings and/or external environmental conditions.

The camera operation settings may indicate which of a preview mode, a photo mode, and a video mode the mode of a camera module 180 included in an electronic device 101 corresponds to. The preview mode may be a mode in which a screen captured by the image sensor is provided as a preview to a user when the camera module does not perform photo shooting or video shooting. The photo mode may be a mode in which the camera module takes a photo. The video mode may be a mode in which the camera module captures a video.

The external environmental conditions may indicate to which of high illuminance and low illuminance the external environment of the electronic device corresponds. The high illuminance may indicate that a brightness value (BV) corresponding to lux is not less than a specific threshold value. The low illuminance may indicate that the BV is less than the specific threshold value.

The image sensor may not directly identify camera operation settings and external environmental conditions, but may receive the information identified by a processor 120 from the processor of the electronic device.

In step 620, the image sensor determines the operation of the image sensor and the signal to be output, based on the camera operation settings and/or external environmental conditions identified in step 610. Hereinafter, the operation and output signals of the image sensor according to the identified camera operation settings and/or external environmental conditions will be described in detail with reference to Table 1, below.

TABLE 1

|  | First external environmental condition | | | Second external environmental condition | | |
| --- | --- | --- | --- | --- | --- | --- |
|  | Operation of image sensor | AF information | Output signal | Operation of image sensor | AF information | Output signal |
| First camera operation setting | First to fourth vertical area signals | First AF information, second AF information | First output signal | First to fourth pixel signal, Fifth to eighth pixel signal | First AF information, second AF information, third AF information, fourth AF information | Second output signal |

TABLE 1-continued

|  | First external environmental condition | | | Second external environmental condition | | |
| --- | --- | --- | --- | --- | --- | --- |
|  | Operation of image sensor | AF information | Output signal | Operation of image sensor | AF information | Output signal |
| Second camera operation setting | First to fourth pixel signal, Fifth to eighth pixel signal | First AF information, second AF information, third AF information, fourth AF information | Third output signal | First to fourth vertical area signals | First AF information, second AF information | First output signal |
| Third camera operation setting | First to fourth pixel signal, Fifth to eighth pixel signal | — | Third output signal | First unit pixel signal, Second unit pixel signal |  | First unit pixel signal, Second unit pixel signal |

In Table 1, the first camera operation setting, the second camera operation setting, and the third camera operation setting may be different modes of the camera module 180, respectively. For example, the first camera operation setting may be in a preview mode; the second camera operation setting may be in a video mode; the third camera operation setting may be in a photo mode.

In Table 1, the first external environmental condition and the second external environmental condition may indicate different conditions for the surrounding environment of the camera module 180. For example, the first external environmental condition may be a high illuminance condition; the second external environmental condition may be a low illuminance condition.

In Table 1, the operation of the image sensor may indicate which signal of the image sensor is read out by the image sensor, depending on the identified camera operation settings and/or external environmental conditions.

In Table 1, AF information may be information about auto focus, and may mean what AF information the image sensor forms and outputs to the processor 120, depending on the identified camera operation settings and/or external environmental conditions.

In Table 1, the output signal may be a signal to be output by the display device 160 of the electronic device, and may mean which output signal the image sensor forms and outputs to the processor 120, depending on the identified camera operation settings and/or external environmental conditions.

Referring to Table 1, the image sensor may detect a first vertical area signal, a second vertical area signal, a third vertical area signal, and a fourth vertical area signal, and may generate and output first AF information, second AF information, and a first output signal, based on the first camera operation setting and the first external environmental condition. Hereinafter, the vertical area signal, AF information, and output signal will be described in detail with reference to FIGS. 7 and 8.

Referring to FIGS. 7 and 8, the image sensor 300 includes the synthetic signal forming unit 701, the disparity calculation unit 702, and the remosaic processing unit 703. The synthetic signal forming unit 701, the disparity calculation unit 702, and the remosaic processing unit 703 of FIG. 7 are illustrated as a block diagram of pieces of hardware included in the image sensor 300. However, the synthetic signal forming unit 701, the disparity calculation unit 702, and the remosaic processing unit 703 may be implemented with software.

The image sensor 300 may detect the first vertical area signal, the second vertical area signal, the third vertical area signal, and the fourth vertical area signal, based on the first camera operation setting and the first external environmental condition The image sensor 300 may detect a first vertical area signal 816, which is a signal for light incident on a first photodiode 811 and a second photodiode 812 through a first micro-lens 815 of a first unit pixel 810, through a scan circuit and may transmit the first vertical area signal 816 to the synthetic signal forming unit 701 of the image sensor 300, based on the first camera operation setting and the first external environmental condition.

In the same manner, the image sensor 300 may transmit a third vertical area signal 826, which is a signal for light incident on a fifth photodiode 821 and a sixth photodiode 822 through a second micro-lens 825 of a second unit pixel 820, to the synthetic signal forming unit 701 based on the first camera operation setting mode and the first external environmental condition.

In the same manner, the image sensor 300 may transmit a second vertical area signal 817, which is a signal for light incident on a third photodiode 813 and a fourth photodiode 814, to the synthetic signal forming unit 701 based on the first camera operation setting mode and the first external environmental condition.

In the same manner, the image sensor 300 may transmit a fourth vertical area signal 827, which is a signal for light incident on a seventh photodiode 823 and an eighth photodiode 824, to the synthetic signal forming unit 701 based on the first camera operation setting mode and the first external environmental condition.

In this way, the reason that the image sensor 300 does not detect the signal of each of a first photodiode 811, a second photodiode 812, a third photodiode, a fourth photodiode, a fifth photodiode, and a sixth photodiode, but detects the signal by grouping the photodiodes for each area, may be because the power consumption of an electronic device may be excessive, when a screen is output in real time with a high resolution in a high luminous environment because a preview mode needs to output the screen in real time. Accordingly, the signal to be detected by the image sensor may be reduced to ½ by detecting a signal by grouping photodiodes for each area, and thus this may be to reduce the power consumption.

The image sensor 300 may form first AF information and second AF information and may output the first AF information and the second AF information to a processor 120, based on the first camera operation setting and the first external environmental condition.

The synthetic signal forming unit 701 of the image sensor 300 may synthesize the received first vertical area signal 816 and the received third vertical area signal 826 to form the first AF information.

The synthetic signal forming unit 701 of the image sensor 300 may synthesize the received second vertical area signal 817 and the received fourth vertical area signal 827 to form the second AF information.

The image sensor 300 may output the formed first AF information and the formed second AF information to a processor 120.

The fact that the image sensor 300 may only output the first AF information and the second AF information, which are horizontal focus information, to the processor 120 may be to reduce the power consumption of the electronic device by adjusting the focus only with horizontal focus information without vertical focus information because it is easy to adjust the focus in a high luminous environment. Accordingly, the image sensor outputting horizontal focus information to the processor is described. However, the image sensor may also output only vertical focus information to the processor. The vertical focus information will be described later.

The image sensor 300 may form a first output signal to output the first output signal to a processor 120, based on the first camera operation setting and the first external environmental condition. The image sensor 300 may generate the first output signal that is a sum of the first vertical area signal 816 and the second vertical area signal 817 of the first unit pixel 810, to output the first output signal to the processor, based on the first camera operation setting and the first external environmental condition. The image sensor 300 may generate an output signal corresponding to the first output signal of each of the unit pixels included in a pixel array 332 to output the output signal to the processor, based on the first camera operation setting and the first external environmental condition.

The fact that the image sensor 300 may output a plurality of photodiodes included in a unit pixel as a single signal without processing the signal of each of the plurality of photodiodes included in the unit pixel may be to reduce the power consumption of the electronic device even though a resolution decreases because the resolution has low importance in a preview mode.

Returning to Table 1, the image sensor 300 may detect the first pixel signal, the second pixel signal, the third pixel signal, and the fourth pixel signal per the first unit pixel 810; may detect the fifth pixel signal, the sixth pixel signal, the seventh pixel signal, and the eighth pixel signal per the second unit pixel 820; and may generate and output the first AF information, the second AF information, the third AF information, the fourth AF information, and the second output signal, based on the first camera operation setting and the second external environmental condition. Hereinafter, this will be described in detail with reference to FIGS. 7 and 9.

Referring to FIGS. 7 and 9, the image sensor 300 may detect the first pixel signal, the second pixel signal, the third pixel signal, and the fourth pixel signal per the first unit pixel 810 based on the first camera operation setting and the second external environmental condition. The first pixel signal may correspond to a signal for light incident on the first photodiode 811. The second pixel signal may correspond to a signal for light incident on the second photodiode 812. The third pixel signal may correspond to a signal for light incident on the third photodiode 813. The fourth pixel signal may correspond to a signal for light incident on the fourth photodiode 814.

The image sensor 300 may detect the detected first pixel signal, the detected second pixel signal, the detected third pixel signal, and the detected fourth pixel signal through a scan circuit to transmit the detected first pixel signal, the detected second pixel signal, the detected third pixel signal, and the detected fourth pixel signal to the synthetic signal forming unit 701 of the image sensor 300.

The image sensor 300 may detect the fifth pixel signal, the sixth pixel signal, the seventh pixel signal, and the eighth pixel signal per the second unit pixel 820 based on the first camera operation setting and the second external environmental condition. The fifth pixel signal may correspond to a signal for light incident on the fifth photodiode 821. The sixth pixel signal may correspond to a signal for light incident on the sixth photodiode 822. The seventh pixel signal may correspond to a signal for light incident on the seventh photodiode 823. The eighth pixel signal may correspond to a signal for light incident on the eighth photodiode 824.

The image sensor 300 may detect the detected fifth pixel signal, the detected sixth pixel signal, the detected seventh pixel signal, and the detected eighth pixel signal through a scan circuit to transmit the detected fifth pixel signal, the detected sixth pixel signal, the detected seventh pixel signal, and the detected eighth pixel signal to the synthetic signal forming unit 701 of the image sensor 300.

The image sensor 300 may form the first AF information, the second AF information, the third AF information, and the fourth AF information to output the first AF information, the second AF information, the third AF information, and the fourth AF information to a processor 120, based on the first camera operation setting and the second external environmental condition.

The synthetic signal forming unit 701 of the image sensor 300 may synthesize the received first pixel signal, the received second pixel signal, the received fifth pixel signal, and the received sixth pixel signal to form the first AF information.

The synthetic signal forming unit 701 of the image sensor 300 may synthesize the received third pixel signal, the received fourth pixel signal, the received seventh pixel signal, and the received eighth pixel signal to form the second AF information.

The synthetic signal forming unit 701 of the image sensor 300 may synthesize the received first pixel signal, the received third pixel signal, the received fifth pixel signal, and the received seventh pixel signal to form the third AF information.

The synthetic signal forming unit 701 of the image sensor 300 may synthesize the received second pixel signal, the received fourth pixel signal, the received sixth pixel signal, and the received eighth pixel signal to form the fourth AF information.

The image sensor 300 may output the formed first AF information, the formed second AF information, the formed third AF information, and the formed fourth AF information to the processor 120.

The fact that the image sensor 300 may form all of the first AF information and the second AF information that are horizontal focus information, and the third AF information and the fourth AF information that are vertical focus information to output the first AF information, the second AF information, the third AF information, and the fourth AF information to the processor 120 may be to complement the vertical focus information and the horizontal focus information with each other to adjust a focus by using both the vertical focus information and the horizontal focus information because it may be difficult to adjust the focus in a low luminous environment.

The image sensor 300 may form a second output signal to output the second output signal to the processor 120, based on the first camera operation setting and the second external environmental condition. The image sensor 300 may generate the second output signal obtained by summing the first pixel signal, the second pixel signal, the third pixel signal, and the fourth pixel signal to output the summed result to the processor based on the first camera operation setting and the second external environmental condition. The image sensor 300 may generate the output signal corresponding to the second output signal of each of the unit pixels included in a pixel array 332 based on the first camera operation setting and the second external environmental condition.

The reason that the image sensor 300 sums signals of a plurality of photodiodes included in a unit pixel to output the summed result as a single signal (the second output signal) may be because the resolution of the displayed screen has low importance in the preview mode.

Returning to Table 1, the image sensor 300 may detect the first pixel signal, the second pixel signal, the third pixel signal, and the fourth pixel signal per the first unit pixel 810; may detect the fifth pixel signal, the sixth pixel signal, the seventh pixel signal, and the eighth pixel signal per the second unit pixel 820; and may generate and output the first AF information, the second AF information, the third AF information, the fourth AF information, and the third output signal, based on the second camera operation setting and the first external environmental condition. The description about the operation and AF information output of the image sensor 300 based on the second camera operation setting and the first external environmental condition may be the same as that in the case of the first camera operation setting and the second external environmental condition, and thus the description will be omitted. The third output signal may correspond to the Bayer-patterned image. Hereinafter, the third output signal will be described in detail with reference to FIGS. 7 and 9.

Referring to FIGS. 7 and 9, a pixel array 910 of the image sensor 300 may include a plurality of photodiodes including a first photodiode 811, a second photodiode 812, a third photodiode 813, a fourth photodiode 814, a fifth photodiode 821, a sixth photodiode 822, a seventh photodiode 823, and an eighth photodiode 824. Additional photodiodes may also be included in the plurality of photodiodes. The image sensor 300 may detect the first pixel signal, the second pixel signal, the third pixel signal, the fourth pixel signal, the fifth pixel signal, the sixth pixel signal, the seventh pixel signal, and the eighth pixel signal from the plurality of photodiodes including the first photodiode 811, the second photodiode 812, the third photodiode 813, the fourth photodiode 814, the fifth photodiode 821, the sixth photodiode 822, the seventh photodiode 823, and the eighth photodiode 824 based on the second camera operation setting and the first external environmental condition, respectively.

The remosaic processing unit 703 of the image sensor 300 may form a Bayer-patterned image 920 by converting the detected first pixel signal, the detected second pixel signal, the detected third pixel signal, the detected fourth pixel signal, the detected fifth pixel signal, the detected sixth pixel signal, the detected seventh pixel signal, and the detected eighth pixel signal.

The Bayer-patterned image may mean a pattern in which green (G) and each of red (R) and blue (B) are intersected with each other such that green (G) is 50%, and each of red (R) and blue (B) are 25% depending on visual characteristics of a human. Additionally, it may be necessary to convert signals detected by the image sensor into Bayer-patterned images when the image signal processor 260 performs image signal processing (ISP).

A process of converting signals (the first pixel signal, the second pixel signal, the third pixel signal, the fourth pixel signal, the fifth pixel signal, the sixth pixel signal, the seventh pixel signal, and the eighth pixel signal) detected by the image sensor into the Bayer-patterned image 920 may include a process such as rearranging, synthesizing, averaging, weighting, and adjusting contrast of an edge portion of the signals detected by the image sensor 300. The algorithm applied to the signals detected by the image sensor 300 to form the Bayer-patterned image 920 may be referred to as a remosaic algorithm. The content of the remosaic algorithm may vary for each manufacturer of an image sensor. The algorithm applied to the signals detected by the image sensor to form an image may be collectively referred to as a remosaic algorithm.

The image sensor 300 may form a third output signal, which is the Bayer-patterned image 920, to output the third output signal to a processor 120, based on the second camera operation setting and the first external environmental condition.

The reason that the image sensor 300 may detect the signal of each of a plurality of photodiodes included in a unit pixel to form and output a Bayer-patterned image through processing may be because that maintaining a resolution may be more important than reducing a power consumption of an electronic device, in a video mode. Returning to Table 1, the image sensor 300 may detect a first vertical area signal, a second vertical area signal, a third vertical area signal, and a fourth vertical area signal, and may generate and output first AF information, second AF information, and a first output signal, based on the second camera operation setting and the second external environmental condition. The description about the operation, AF information, and output signal of the image sensor 300 based on the second camera operation setting and the second external environmental condition may be the same as that in the case of the first camera operation setting and the first external environmental condition, and thus the description will be omitted.

The fact that the image sensor 300 may detect the signal by grouping a plurality of photodiodes by area without detecting the signal of each of the plurality of photodiodes included in the unit pixel and output only the first AF information and the second AF information, which are horizontal focus information, to a processor when the image sensor 300 is in the second camera operation setting and the second external environmental condition may be to reduce detection noise (read out noise) by reducing the signal detected by the image sensor to complement the quality of a video in low luminous environments because sufficient exposure time is not secured in low illuminance.

Returning to Table 1, the image sensor 300 may detect the first pixel signal, the second pixel signal, the third pixel signal, and the fourth pixel signal per the first unit pixel 810; may detect the fifth pixel signal, the sixth pixel signal, the seventh pixel signal, and the eighth pixel signal per the second unit pixel 820; and may generate and output the third output signal, based on the third camera operation setting and the first external environmental condition. The description about the operation and output signal of the image sensor 300 based on the third camera operation setting and the first external environmental condition may be the same as that in the case of the second camera operation setting and the first external environmental condition, and thus the description will be omitted.

The image sensor 300 may not generate AF information in the case of the third camera operation setting and the first external environmental condition. This may be because there is no need to separately form AF information in a photo mode as long as the AF information formed in the preview mode is used. Furthermore, the fact that the image sensor 300 forms the third output signal (a Bayer-patterned image) when the image sensor 300 is in the third camera operation setting and the first external environmental condition may be to output a high-resolution photo in a high luminous environment. Returning to Table 1, the image sensor 300 may detect the first unit pixel signal and the second unit pixel signal and may output the first unit pixel signal and the second unit pixel signal, based on the third camera operation setting and the second external environmental condition.

When the image sensor 300 is in the third camera operation setting and the second external environmental condition, the image sensor 300 may detect the first unit pixel signal that is a signal corresponding to the first unit pixel 810. Besides, the image sensor 300 may detect the second unit pixel signal that is a signal corresponding to the second unit pixel 820. The image sensor 300 may output the detected first unit pixel signal and the detected second unit pixel signal to a processor. The reason that the image sensor 300 groups and detects signals of a plurality of photodiodes included in a unit pixel in the third camera operation setting and the second external environmental condition may be focused on reducing the power consumption of an electronic device because the resolution of photo may be meaningless in a low luminous environment.

The image sensor 300 may not generate AF information in the case of the third camera operation setting and the second external environmental condition. This may be because there is no need to separately form AF information in a photo mode as long as the AF information formed in the preview mode is used.

Hereinafter, the output signals of an image sensor will be described with reference to FIGS. 10 and 11. The same configurations as those of the above-described embodiment may be referenced by the same reference numerals, and description thereof may be omitted.

Figure 10:
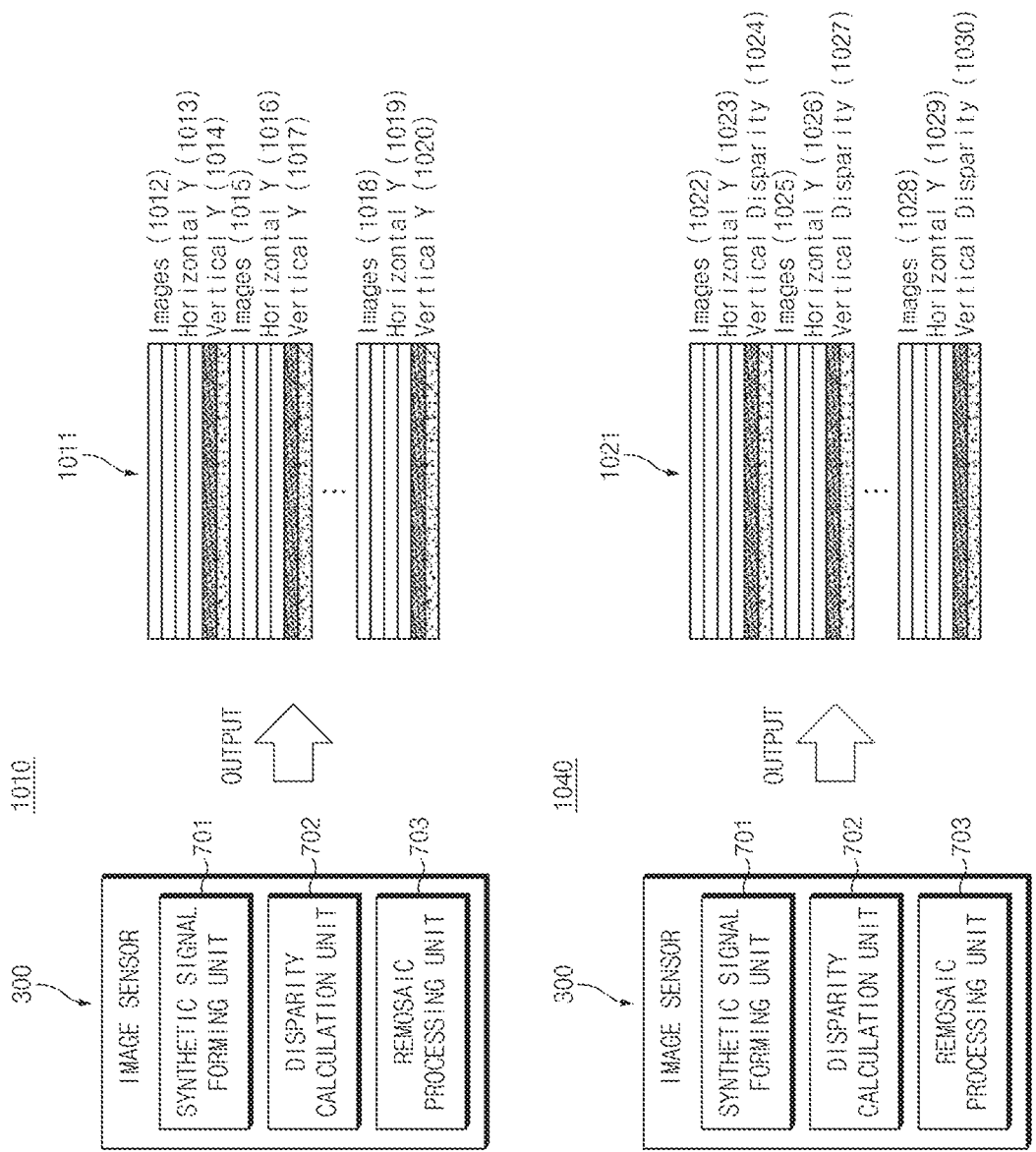
FIG. 10 is a diagram illustrating two cases of outputting signals of an image sensor, according to an embodiment.
Figure 11:
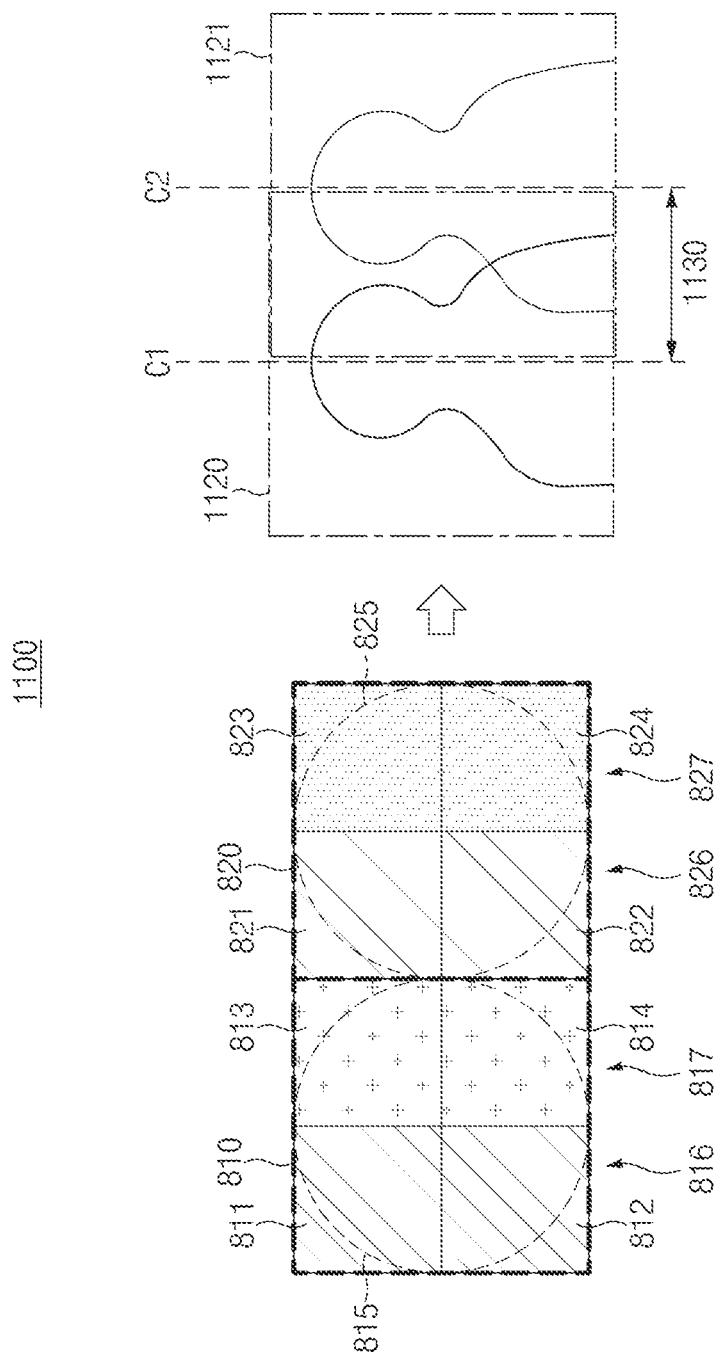
FIG. 11 is a diagram illustrating a method of calculating a disparity of an image sensor, according to an embodiment.

FIG. 10 is a diagram illustrating a first case 1010 and a second case 1040 of outputting signals of an image sensor, according to an embodiment. FIG. 11 is a diagram 1100 illustrating a method of calculating a disparity of an image sensor, according to an embodiment.

Referring to FIG. 10, the image sensor 300 outputs first output signals 1011 or second output signals 1021 to a processor 120. The case where the image sensor 300 outputs the first output signals 1011 will be described first. The first output signals 1011 may be signals for outputting a single frame. In a case of the first camera operation setting and the second external environmental condition or in a case of the second camera operation setting and the first external environmental condition, the first output signals 1011 may be signals that allow the image sensor 300 to output a single frame.

The image sensor 300 may not transmit all pieces of horizontal focus information (horizontal Y) including partial signal 1013, partial signal 1016, and partial signal 1019, and all pieces of vertical focus information (vertical Y) including partial signal 1014, partial signal 1017, and partial signal 1020 after transmitting all image signals including partial signal 1012, partial signal 1015, and partial signal 1018 for a single frame, but alternately transmit signals, for example, a partial signal 1012 of image signals, a partial signal 1013 of horizontal focus information, a partial signal 1014 of vertical focus information, a partial signal 1015 of image signals, a partial signal 1016 of horizontal focus information, and a partial signal 1017 of vertical focus information. As described above, the horizontal focus information may include the first AF information and second AF information. In addition, the vertical focus information may include the third AF information and the fourth AF information.

Each of the signals 1012 to 1020 for a single frame may be divided into a virtual channel (VC) and data type (DT) of separate signal specification (e.g., mobile industry processor interface (MIPI)) and may be transmitted to the processor. Examples of VC and DT for each signal are shown in Table 2, below.

TABLE 2

| | Virtual channel (VC) | Data type (DT) |
|---|---|---|
| Image signals | 0 | 0x12 |
| Horizontal focus information (Horizontal Y) | 1 | 0x12 |
| Vertical focus information (Vertical Y) | 2 | 0x12 |
| Vertical disparity information (Vertical disparity) | 3 | 0x12 |

In Table 2, vertical disparity information (Vertical disparity) will be described later.

Hereinafter, the case where the image sensor 300 outputs the second output signals 1021 is described. The second output signals 1021 may be signals for outputting a single frame. In the case of the first camera operation setting and the second external environmental condition or in the case of the second camera operation setting and the first external environmental condition, the second output signals 1021 may be signals that allow the image sensor 300 to output a single frame.

The image sensor 300 may alternately transmit signals, for example, a partial signal 1022 of image signals, a partial signal 1023 of horizontal focus information, a partial signal 1024 of vertical disparity information (Vertical disparity), a partial signal 1025 of image signals, a partial signal 1026 of horizontal focus information, and a partial signal 1027 of vertical disparity information.

Hereinafter, disparity information will be described in detail with reference to FIGS. 10 and 11. The same configurations as those of the above-described embodiment may be referenced by the same reference numerals, and description thereof may be omitted.

The image sensor 300 may form a left signal image 1120 by synthesizing the first vertical area signal 816 and the third vertical area signal 826. That is, the image sensor 300 may form the left signal image 1120 based on the first AF information.

Moreover, the image sensor 230 may form a right signal image 1121 by synthesizing the second vertical area signal 817 and the fourth vertical area signal 827. That is, the image sensor 300 may form the right signal image 1121 based on the second AF information.

The disparity calculation unit 702 of the image sensor 230 may calculate horizontal disparity information (Horizontal disparity), which is the disparity between the left signal image including partial signal 1013, partial signal 1016, or partial signal 1019 and the right signal image including partial signal 1013, partial signal 1016, or partial signal 1019. The horizontal disparity may be a distance between the center line c1 of the left signal image including partial signal 1013, partial signal 1016, or partial signal 1019 and the center line c2 of the right signal image including partial signal 1013, partial signal 1016, or partial signal 1019. As the horizontal disparity is greater, this may mean that the extent to which the image captured by the image sensor 300 is out of focus is greater. When the center line c1 of the left signal image including partial signal 1013, partial signal 1016, or partial signal 1019 completely overlaps with the centerline c2 of the right signal image including partial signal 1013, partial signal 1016, or partial signal 1019, the horizontal disparity 1130 is 0. This may mean that the image sensor 300 is in the on-focus state. Identically, the disparity calculation unit 702 of the image sensor 230 may calculate vertical disparity information (Vertical disparity) including partial signal 1024, partial signal 1027, or partial signal 1030 that is the disparity between the upper signal image including partial signal 1014, partial signal 1017, or partial signal 1020 and the lower signal image including partial signal 1014, partial signal 1017, or partial signal 1020.

Returning to FIG. 10, the image sensor 300 may output vertical disparity information (Vertical disparity) including partial signal 1024, partial signal 1027, or partial signal 1030 to a processor instead of vertical focus information (Vertical Y) including partial signal 1014, partial signal 1017, or partial signal 1020.

Hereinafter, an embodiment in which a unit pixel included in a pixel array of an image sensor includes a 3×3 array of photodiodes will be described in detail with reference to FIG. 12.

Figure 12:
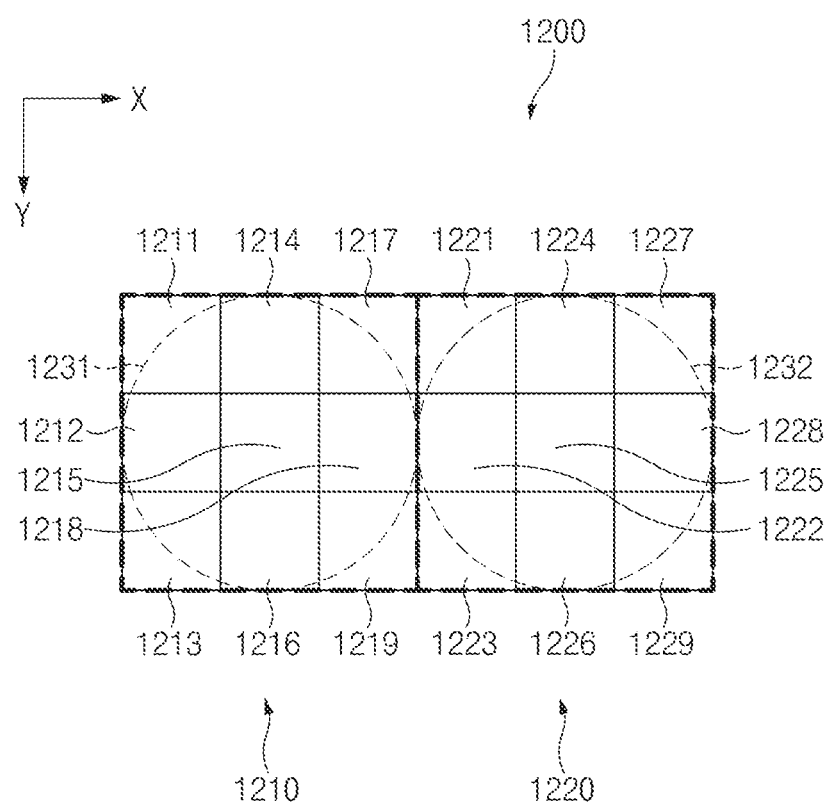
FIG. 12 is a diagram illustrating unit pixels included in a pixel array of an image sensor, according to an embodiment.

FIG. 12 is a diagram 1200 illustrating unit pixels included in a pixel array of an image sensor, according to an embodiment. The operation of the image sensor is the same as in the above-described embodiment, and thus only the definition of the vertical area signal and AF information in the case where a unit pixel includes a 3×3 array of photodiodes will be described.

Referring to FIG. 12, each of a plurality of unit pixels include 3×3 photodiodes. For example, a first unit pixel 1210 includes a first photodiode 1211, a second photodiode 1212, a third photodiode 1213, a fourth photodiode 1214, a fifth photodiode 1215, a sixth photodiode 1216, a seventh photodiode 1217, an eight photodiode 1218, and a ninth photodiode 1219 arranged to overlap with a first micro-lens 1231. The description of the first unit pixel 1210 may also be applied to a second unit pixel 1220.

The first vertical area signal of the first unit pixel 1210 may mean a signal detected in the first photodiode 1211, the second photodiode 1212, the third photodiode 1213, the fourth photodiode 1214, the fifth photodiode 1215, and the sixth photodiode 1216. The second vertical area of the first unit pixel 1210 may include the fourth photodiode 1214, the fifth photodiode 1215, the sixth photodiode 1216, the seventh photodiode 1217, the eighth photodiode 1218, and the ninth photodiode 1219.

The third vertical area of the second unit pixel 1220 may include a tenth photodiode 1221, an eleventh photodiode 1222, a twelfth photodiode 1223, the thirteenth photodiode 1224, the fourteenth photodiode 1225, and the fifteenth photodiode 1226. The fourth vertical area of the second unit pixel 1220 may include the thirteenth photodiode 1224, the fourteenth photodiode 1225, the fifteenth photodiode 1226, a sixteenth photodiode 1227, a seventeenth photodiode 1228, and an eighteenth photodiode 1229.

The first AF information may be formed based on the first vertical area signal of the first unit pixel 1210 and the third vertical area signal of the second unit pixel 1220. The second AF information may be formed based on the second vertical area signal of the first unit pixel 1210 and the fourth vertical area signal of the second unit pixel 1220.

The unit pixel is not limited to 2×2 photodiodes or 3×3 photodiodes. For example, an image sensor may include n×n photodiodes per unit pixel.

According to an embodiment of the disclosure, an electronic device may include an image sensor including a first unit pixel including a first micro-lens and a plurality of first photodiodes facing each other with a first color filter interposed between the plurality of first photodiodes, and a second unit pixel including a second micro-lens and a plurality of second photodiodes facing each other with a second color filter interposed between the plurality of second photodiodes, a camera module including the image sensor, and a processor operatively connected with the image sensor. The first unit pixel may include a first photodiode, a second photodiode, a third photodiode, and a fourth photodiode, which are disposed in a square shape such that a horizontal number of photodiodes is identical to a vertical number of photodiodes. The second unit pixel may include a fifth photodiode, a sixth photodiode, a seventh photodiode, and an eighth photodiode, which are disposed in a square shape such that a horizontal number of photodiodes is identical to a vertical number of photodiodes. The image sensor may identify an operation setting and an external environmental condition of the camera module, and, upon identifying that the operation setting is a preview mode and the external environmental condition is a high luminous environment, the image sensor may identify a first area signal corresponding to a signal of the first photodiode and the second photodiode, which are concatenated with each other and included in the first unit pixel, and the image sensor may identify a second area signal that corresponds to a signal of the fifth photodiode, included in the second unit pixel, corresponding to a location of the first photodiode and the sixth photodiode, included in the second unit pixel corresponding to a location of the second photodiode, and may form first AF information based on the first area signal and the second area signal.

Upon identifying that the operation setting is the preview mode and the external environmental condition is the high luminous environment, the image sensor may identify a third area signal corresponding to a signal of the third photodiode and the fourth photodiode, which are concatenated with each other and included in the first unit pixel, may identify a fourth area signal that corresponds to a signal of the seventh photodiode and the eighth photodiode in the second unit pixel, may form second AF information based on the third area signal and the fourth area signal, and may output the formed first AF information and the formed second AF information to the processor.

The image sensor may output an image signal for a preview image to the processor, and the image signal may include a signal obtained by synthesizing the first area signal and the second area signal, and a signal obtained by synthesizing the third area signal and the fourth area signal.

Upon identifying that the operation setting is the preview mode and the external environmental condition is a low luminous environment, the image sensor may form the first AF information based on a first pixel signal of the first photodiode, a second pixel signal of the second photodiode, a fifth pixel signal of the fifth photodiode, and a sixth pixel signal of the sixth photodiode; may form second AF information based on a third pixel signal of the third photodiode, a fourth pixel signal of the fourth photodiode, a seventh pixel signal of the seventh photodiode, and an eighth pixel signal of the eighth photodiode; may form third AF information based on the first pixel signal of the first photodiode, the third pixel signal of the third photodiode, the fifth pixel signal of the fifth photodiode, and the seventh pixel signal of the seventh photodiode; may form fourth AF information based on the second pixel signal of the second photodiode, the fourth pixel signal of the fourth photodiode, the sixth pixel signal of the sixth photodiode, and the eighth pixel signal of the eighth photodiode; may output the formed first AF information and the formed second AF information to the processor; and may output the formed third AF information and the formed fourth AF information to the processor.

The image sensor outputs an image signal for a preview image to the processor, and the image signal may include a signal obtained by synthesizing the first pixel signal, the second pixel signal, the third pixel signal, and the fourth pixel signal, and a signal obtained by synthesizing the fifth pixel signal, the sixth pixel signal, the seventh pixel signal, and the eighth pixel signal.

Upon identifying that the operation setting is a video mode and the external environmental condition is the high luminous environment, the image sensor may identify a first pixel signal of the first photodiode, a second pixel signal of the second photodiode, a third pixel signal of the third photodiode, a fourth pixel signal of the fourth photodiode, a fifth pixel signal of the fifth photodiode, a sixth pixel signal of the sixth photodiode, a seventh pixel signal of the seventh photodiode, and an eighth pixel signal of the eighth photodiode; may form a Bayer-patterned image by applying a remosaic algorithm to the first pixel signal, the second pixel signal, the third pixel signal, the fourth pixel signal, the fifth pixel signal, the sixth pixel signal, the seventh pixel signal, and the eighth pixel signal; and may output the Bayer-patterned image as an image signal to the processor.

The image sensor may form the first AF information based on the first pixel signal, the second pixel signal, the fifth pixel signal and the sixth pixel signal; may form second AF information based on the third pixel signal, the fourth pixel signal, the seventh pixel signal and the eighth pixel signal; may form third AF information based on the first pixel signal, the third pixel signal, the fifth pixel signal and the seventh pixel signal; may form fourth AF information based on the second pixel signal, the fourth pixel signal, the sixth pixel signal and the eighth pixel signal; may output the formed first AF information and the formed second AF information to the processor; and may output the formed third AF information and the formed fourth AF information to the processor.

Upon identifying that the operation setting is a video mode and the external environmental condition is a low luminous environment, the image sensor may identify the first area signal corresponding to the signal of the first photodiode and the second photodiode, may identify the second area signal corresponding to the signal of the fifth photodiode and the sixth photodiode, may form the first AF information based on the first area signal and the second area signal, may identify a third area signal corresponding to a signal of the third photodiode and the fourth photodiode, may identify a fourth area signal that corresponds to a signal of the seventh photodiode and the eighth photodiode, may form second AF information based on the third area signal and the fourth area signal, and may output the formed first AF information and the formed second AF information to the processor.

The image sensor may output an image signal for a video captured with the camera module, to the processor, and the image signal may include a signal obtained by synthesizing the first area signal and the second area signal, and a signal obtained by synthesizing the third area signal and the fourth area signal.

Upon identifying that the operation setting is a photo mode and the external environmental condition is a high luminous environment, the image sensor may identify a first pixel signal of the first photodiode, a second pixel signal of the second photodiode, a third pixel signal of the third photodiode, a fourth pixel signal of the fourth photodiode, a fifth pixel signal of the fifth photodiode, a sixth pixel signal of the sixth photodiode, a seventh pixel signal of the seventh photodiode, and an eighth pixel signal of the eighth photodiode; may form a Bayer-patterned image by applying a remosaic algorithm to the first pixel signal, the second pixel signal, the third pixel signal, the fourth pixel signal, the fifth pixel signal, the sixth pixel signal, the seventh pixel signal, and the eighth pixel signal; and may output the Bayer-patterned image as an image signal to the processor.

Upon identifying the operation settings is a photo mode and the external environmental condition is a low luminous environment, the image sensor may identify a first unit pixel signal that is a signal of the first photodiode, the second photodiode, the third photodiode and the fourth photodiode; may identify a second unit pixel signal that is a signal of the fifth photodiode, the sixth photodiode, the seventh photodiode and the eighth photodiode; and may output an image signal including the first unit pixel signal and the second unit pixel signal to the processor.

According to an embodiment of the disclosure, an operating method of an electronic device including an image sensor including a first unit pixel including a first micro-lens and a plurality of photodiodes disposed in a square shape such that a horizontal number of photodiodes is identical to a vertical number of photodiodes, and a second unit pixel including a second micro-lens and a plurality of photodiodes, which face each other and are disposed in a square shape such that a horizontal number of photodiodes is identical to a vertical number of photodiodes, a camera module including the image sensor, and a processor operatively connected with the image sensor may include identifying, by the image sensor, an operation setting and an external environmental condition of the camera module, upon identifying that the operation setting is a preview mode and the external environmental condition is a high luminous environment, or upon identifying that the operation setting is a video mode and the external environmental condition is a low luminous environment, identifying a first area signal corresponding to a signal of a first photodiode and a second photodiode, which are concatenated with each other and which are included in the first unit pixel, identifying a second area signal corresponding to a signal of a fifth photodiode corresponding to a location of the first photodiode, and a sixth photodiode corresponding to a location of the second photodiode, wherein the fifth photodiode and the sixth photodiode are included in the second unit pixel, and forming first AF information based on the first area signal and the second area signal.

Upon identifying that the operation setting is the preview mode and the external environmental condition is the high luminous environment, or upon identifying that the operation setting is the video mode and the external environmental condition is the low luminous environment, the method may further include identifying, by the image sensor, a third area signal corresponding to a signal of a third photodiode and a fourth photodiode, which are concatenated with each other and which are included in the first unit pixel, identifying, by the image sensor, a fourth area signal corresponding to a signal of a seventh photodiode and an eighth photodiode, which are included in the second unit pixel, forming, by the image sensor, second AF information based on the third area signal and the fourth area signal, and outputting, by the image sensor, the formed first AF information and the formed second AF information to the processor.

The method may further include outputting, by the image sensor, an image signal for a preview image to the processor. The image signal may include a signal obtained by synthesizing the first area signal and the second area signal, and a signal obtained by synthesizing a third area signal and a fourth area signal.

Upon identifying that the operation setting is the preview mode and the external environmental condition is the low luminous environment, or upon identifying that the operation setting is the video mode and the external environmental condition is the high luminous environment, the method may further include forming the first AF information based on a first pixel signal of the first photodiode, a second pixel signal of the second photodiode, a fifth pixel signal of the fifth photodiode, and a sixth pixel signal of the sixth photodiode; forming second AF information based on a third pixel signal of a third photodiode, a fourth pixel signal of a fourth photodiode, a seventh pixel signal of a seventh photodiode, and an eighth pixel signal of an eighth photodiode; forming third AF information based on the first pixel signal of the first photodiode, the third pixel signal of the third photodiode, the fifth pixel signal of the fifth photodiode, and the seventh pixel signal of the seventh photodiode; forming fourth AF information based on the second pixel signal of the second photodiode, the fourth pixel signal of the fourth photodiode, the sixth pixel signal of the sixth photodiode, and the eighth pixel signal of the eighth photodiode; outputting the formed first AF information and the formed second AF information to the processor; and outputting the formed third AF information and the formed fourth AF information to the processor.

Upon identifying that the operation setting is the preview mode and the external environmental condition is the low luminous environment, the image sensor may output an image signal for a preview image to the processor. The image signal may include a signal obtained by synthesizing the first pixel signal, the second pixel signal, the third pixel signal, and the fourth pixel signal, and a signal obtained by synthesizing the fifth pixel signal, the sixth pixel signal, the seventh pixel signal, and the eighth pixel signal.

Upon identifying that the operation setting is the video mode and the external environmental condition is the high luminous environment, the method may further include forming a Bayer-patterned image by applying a remosaic algorithm to the first pixel signal, the second pixel signal, the third pixel signal, the fourth pixel signal, the fifth pixel signal, the sixth pixel signal, the seventh pixel signal, and the eighth pixel signal, and outputting the Bayer-patterned image as an image signal to the processor.

Upon identifying that the operation setting is a photo mode and the external environmental condition is the high luminous environment, the method may further include identifying a first pixel signal of the first photodiode, a second pixel signal of the second photodiode, a third pixel signal of a third photodiode, a fourth pixel signal of a fourth photodiode, a fifth pixel signal of the fifth photodiode, a sixth pixel signal of the sixth photodiode, a seventh pixel signal of a seventh photodiode, and an eighth pixel signal of an eighth photodiode; forming a Bayer-patterned image by applying a remosaic algorithm to the first pixel signal, the second pixel signal, the third pixel signal, the fourth pixel signal, the fifth pixel signal, the sixth pixel signal, the seventh pixel signal, and the eighth pixel signal; and outputting the Bayer-patterned image as an image signal to the processor.

Upon identifying that the operation setting is a photo mode and the external environmental condition is the low luminous environment, the method may further include identifying a first unit pixel signal that is a signal of the first photodiode, the second photodiode, a third photodiode and a fourth photodiode; identifying a second unit pixel signal that is a signal of the fifth photodiode, the sixth photodiode, a seventh photodiode and an eighth photodiode; and outputting an image signal including the first unit pixel signal and the second unit pixel signal to the processor.

It should be understood that various embodiments of the disclosure and terms used in the embodiments do not intend to limit technical features to the particular embodiment disclosed herein; rather, the disclosure should be construed to cover various modifications, equivalents, or alternatives of embodiments of the disclosure. With regard to description of drawings, similar or related components may be assigned with similar reference numerals. As used herein, singular forms of words corresponding to an item may include one or more items unless the context clearly indicates otherwise. In the disclosure, each of the expressions "A or B", "at least one of A and B", "at least one of A or B", "A, B, or C", "one or more of A, B, and C", or "one or more of A, B, or C", may include any and all combinations of one or more of the associated listed items. The expressions, such as "a first", "a second", "the first", or "the second", may be used merely for the purpose of distinguishing a component from the other components, but do not limit the corresponding components in other aspect (e.g., the importance or the order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

The term "module" used in the disclosure may include a unit implemented in hardware, software, or firmware and may be interchangeably used with the terms "logic", "logical block", "part" and "circuit". The "module" may be a minimum unit of an integrated part or may be a part thereof. The "module" may be a minimum unit for performing one or more functions or a part thereof. The "module" may include an application-specific integrated circuit (ASIC).

Various embodiments of the disclosure may be implemented by software (e.g., the program 140) including an instruction stored in a machine-readable storage medium (e.g., an internal memory 136 or an external memory 138) readable by a machine (e.g., the electronic device 101). For example, the processor (e.g., the processor 120) of a machine (e.g., the electronic device 101) may call the instruction from the machine-readable storage medium and execute the instructions thus called. This means that the machine may perform at least one function based on the called at least one instruction. The one or more instructions may include a code generated by a compiler or executable by an interpreter. The machine-readable storage medium may be provided in the form of non-transitory storage medium. Here, the term "non-transitory", as used herein, means that the storage medium is tangible, but does not include a signal (e.g., an electromagnetic wave). The term "non-transitory" does not differentiate a case where the data is permanently stored in the storage medium from a case where the data is temporally stored in the storage medium.

The method according to various embodiments disclosed in the disclosure may be provided as a part of a computer program product. The computer program product may be traded between a seller and a buyer as a product. The computer program product may be distributed in the form of machine-readable storage medium (e.g., a compact disc read only memory (CD-ROM)) or may be directly distributed (e.g., download or upload) online through an application store (e.g., a Play Store™) or between two user devices (e.g., the smartphones). In the case of online distribution, at least a portion of the computer program product may be temporarily stored or generated in a machine-readable storage medium such as a memory of a manufacturer's server, an application store's server, or a relay server.

Each component (e.g., the module or the program) of the above-described components may include one or plural entities. According to various embodiments, at least one or more components of the above components or operations may be omitted, or one or more components or operations may be added. Additionally or alternatively, some components (e.g., the module or the program) may be integrated in one component. In this case, the integrated component may perform the same or similar functions performed by each corresponding components prior to the integration. According to various embodiments, operations performed by a module, a programming, or other components may be executed sequentially, in parallel, repeatedly, or in a heuristic method, or at least some operations may be executed in different sequences, omitted, or other operations may be added.

According to embodiments disclosed in this specification, it is possible to implement a high-resolution image by applying AF information differently and the output of an image sensor depending on camera operation settings and external environmental conditions.

Besides, a variety of effects directly or indirectly understood through the specification may be provided.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device comprising:
an image sensor including a plurality of unit pixels including a first unit pixel and a second unit pixel, the first unit pixel including a first micro-lens, a first color filter disposed under the first micro-lens, and a first photodiode-array disposed under the first color filter and including a plurality of photodiodes arranged in a same number of columns and rows as each other, and the second unit pixel including a second micro-lens, a second color filter disposed under the second micro-lens and having a different color from that of the first color filter, and a second photodiode-array disposed under the second color filter and including a plurality of photodiodes arranged in a same number of columns and rows as each other; and
a processor operatively coupled with the image sensor, wherein the processor is configured to:
identify a luminance level corresponding to an external environment of the electronic device;
if the mode is identified as a first mode where the luminance level falls into a first range, perform the auto-focus function based at least in part on comparing a first combined signal generated by combining signals obtained from a first column of the first photodiode-array with a second combined signal generated by combining signals obtained from a second column of the first photodiode-array;
if the mode is identified as a second mode where the luminance level falls into a second range lower than the first range, perform the auto-focus function based at least in part on comparing the first combined signal with the second combined signal and comparing a third combined signal generated by combining signals obtained from a first row of the first photodiode-array with a fourth combined signal generated by combining signals obtained from a second row of the first photodiode-array;
generate an image signal based at least in part on signals obtained from the first unit pixel and the second unit pixel while the auto-focus function is performed according to a one of the first mode and the second mode;
identify a live-preview mode for shooting; and
generate the image signal for a preview image based on a first synthesizing signal and a second synthesizing signal, different than the first synthesizing signal.

2. The electronic device of claim 1, wherein the processor is configured to:
perform the identifying of the luminance level using one or more signals obtained via a luminance sensor external to the image sensor.

3. The electronic device of claim 1, wherein the processor is further configured to:
provide, via a display, a live-preview corresponding to one or more external objects while the auto-focus function is set according to the first mode; and
based on receiving a capture signal, capture a photograph image corresponding to the one or more external objects while the auto-focus function is set according to the second mode.

4. The electronic device of claim 1, wherein the processor is further configured to:
perform a remosaic between the first unit pixel and the second unit pixel to generate the image signal.

5. The electronic device of claim 1, wherein the processor is further configured to:
obtain the first synthesizing signal by synthesizing the first unit pixel, and
obtain the second synthesizing signal by synthesizing the second unit pixel.

6. The electronic device of claim 5, wherein the processor is further configured to:
identify a video mode or a photograph mode.

7. The electronic device of claim 6, wherein the processor is further configured to:
if the luminance level falls into the first range in the video mode or the photograph mode, perform a remosaic between the first unit pixel and the second unit pixel to generate the image signal.

8. The electronic device of claim 7, wherein the processor is further configured to:
if the luminance level falls into the second range lower than the first range in the video mode or the photograph mode, generate the image signal for the preview image based on the first synthesizing signal and the second synthesizing signal.

9. The electronic device of claim 7, wherein the processor is further configured to:
generate a Bayer-patterned image by performing the remosaic to the first unit pixel and the second unit pixel.

10. An electronic device comprising:
a memory;
a display;
a camera module including an image sensor, the image sensor including a plurality of unit pixels including a first unit pixel and a second unit pixel, the first unit pixel including a first micro-lens, a first color filter disposed under the first micro-lens, and a first photodiode-array disposed under the first color filter and including a plurality of photodiodes arranged in a same number of columns and rows as each other, and the second unit pixel including a second micro-lens, a second color filter disposed under the second micro-lens and having a different color from that of the first color filter, and a second photodiode-array disposed under the second color filter and including a plurality of photodiodes arranged in a same number of columns and rows as each other; and
a processor operatively coupled with the image sensor, wherein the processor is configured to:
identify a luminance level corresponding to an external environment of the electronic device;
if the mode is identified as a first mode where the luminance level falls into a first range, perform the auto-focus function based at least in part on comparing a first combined signal generated by combining signals obtained a first column of the first photodiode-array with a second combined signal generated by combining signals obtained from a second column of the first photodiode-array;
if the mode is identified as a second mode where the luminance level falls into a second range lower than the first range, perform the auto-focus function based at least in part on comparing the first combined signal with the second combined signal and comparing a third combined signal generated by combining signals obtained from a first row of the first photodiode-array with a fourth combined signal generated by combining signals obtained from a second row of the first photodiode-array;
display, via the display, an image generated based at least in part on signals obtained from the first unit pixel and the second unit pixel while the auto-focus function is performed according to a one of the first mode and the second mode;
identify a live-preview mode for shooting; and
generate the image signal for a preview image based on a first synthesizing signal and a second synthesizing signal, different than the first synthesizing signal.

11. The electronic device of claim 10, wherein the processor is further configured to:
perform the identifying of the luminance level using one or more signals obtained via a luminance sensor external to the image sensor.

12. The electronic device of claim 10, wherein the processor is further configured to:
provide, via a display, a live-preview corresponding to one or more external objects while the auto-focus function is set according to the first mode; and
based on receiving a capture signal, capture a photograph image corresponding to the one or more external objects while the auto-focus function is set according to the second mode.

13. The electronic device of claim 10, wherein the processor is further configured to:
perform a remosaic between the first unit pixel and the second unit pixel to generate the image signal.

14. The electronic device of claim 10, wherein the processor is further configured to:
obtain the first synthesizing signal by synthesizing the first unit pixel, and
obtain the second synthesizing signal by synthesizing the second unit pixel.

15. The electronic device of claim 14, wherein the processor is further configured to:
identify a video mode or a photograph mode, and
identify, in the video mode or the photograph mode, the luminance level corresponding to an external environment of the electronic device.

16. The electronic device of claim 15, wherein the processor is further configured to:
if the luminance level falls into the first range in the video mode or the photograph mode, perform a remosaic between the first unit pixel and the second unit pixel to generate the image signal.

17. The electronic device of claim 16, wherein the processor is further configured to:
if the luminance level falls into the second range lower than the first range in the video mode or the photograph mode, generate the image signal for the preview image based on the first synthesizing signal and the second synthesizing signal.

18. The electronic device of claim 16, wherein the processor is further configured to:
generate a Bayer-patterned image by performing the remosaic to the first unit pixel and the second unit pixel.

* * * * *